(12) United States Patent
Li et al.

(10) Patent No.: US 9,059,779 B2
(45) Date of Patent: Jun. 16, 2015

(54) SERIAL DIGITAL INTERFACE BETWEEN AN RF TRANSCEIVER AND A BASEBAND CHIP

(71) Applicant: Aviacomm Inc., Sunnyvale, CA (US)

(72) Inventors: Tao Li, Campbell, CA (US); Hans Wang, Mountain View, CA (US); Binglei Zhang, San Jose, CA (US); Shih Hsiung Mo, San Jose, CA (US)

(73) Assignee: AVIACOMM INC., Santa Clara, CA (US)

( * ) Notice: Subject to any disclaimer, the term of this patent is extended or adjusted under 35 U.S.C. 154(b) by 0 days.

(21) Appl. No.: 14/085,421

(22) Filed: Nov. 20, 2013

(65) Prior Publication Data

US 2014/0146861 A1   May 29, 2014

Related U.S. Application Data

(60) Provisional application No. 61/730,333, filed on Nov. 27, 2012.

(51) Int. Cl.
*H04B 1/38* (2006.01)
*H04B 1/40* (2006.01)
H04B 10/40 (2013.01)
H04L 29/06 (2006.01)
H04M 1/738 (2006.01)

(52) U.S. Cl.
CPC *H04B 1/40* (2013.01); *H04B 10/40* (2013.01); *H04L 29/06027* (2013.01); *H04M 1/738* (2013.01); *H04Q 2213/13034* (2013.01); *H04Q 2213/13248* (2013.01)

(58) Field of Classification Search
CPC .......... H04B 1/40; H04B 1/406; H04B 10/40; H04L 25/0264; H04L 25/0272; H04L 29/06027; H04M 1/738; H04Q 2213/13034; H04Q 2213/13248
USPC .......... 375/219, 316, 220; 341/144; 455/41.2, 455/556.1, 557
See application file for complete search history.

(56) References Cited

U.S. PATENT DOCUMENTS

| | | | |
|---|---|---|---|
| 7,693,236 B2 * | 4/2010 | Pritchett et al. | 375/316 |
| 2007/0182613 A1 * | 8/2007 | Deguchi | 341/144 |
| 2010/0052743 A1 * | 3/2010 | Kamizuma et al. | 327/144 |
| 2012/0033720 A1 * | 2/2012 | Brunel et al. | 375/225 |
| 2012/0224518 A1 * | 9/2012 | Padmanabhan et al. | 370/311 |

\* cited by examiner

*Primary Examiner* — Leila Malek
(74) *Attorney, Agent, or Firm* — Shun Yao; Park, Vaughan, Fleming & Dowler LLP

(57) ABSTRACT

One embodiment of the present invention provides a device for interfacing between a baseband controller and an RF integrated circuit (IC) chip having a modulator and a demodulator. The device includes an analog-to-digital converter (ADC) coupled to the demodulator located on the RF IC chip. The ADC is configured to receive demodulated analog signals from the demodulator. The device further includes a serializer configured to generate a serial data frame based on the ADC's output, a first serial data port configured to send the serial data frame to the baseband controller, and a control module coupled to the baseband controller.

14 Claims, 10 Drawing Sheets

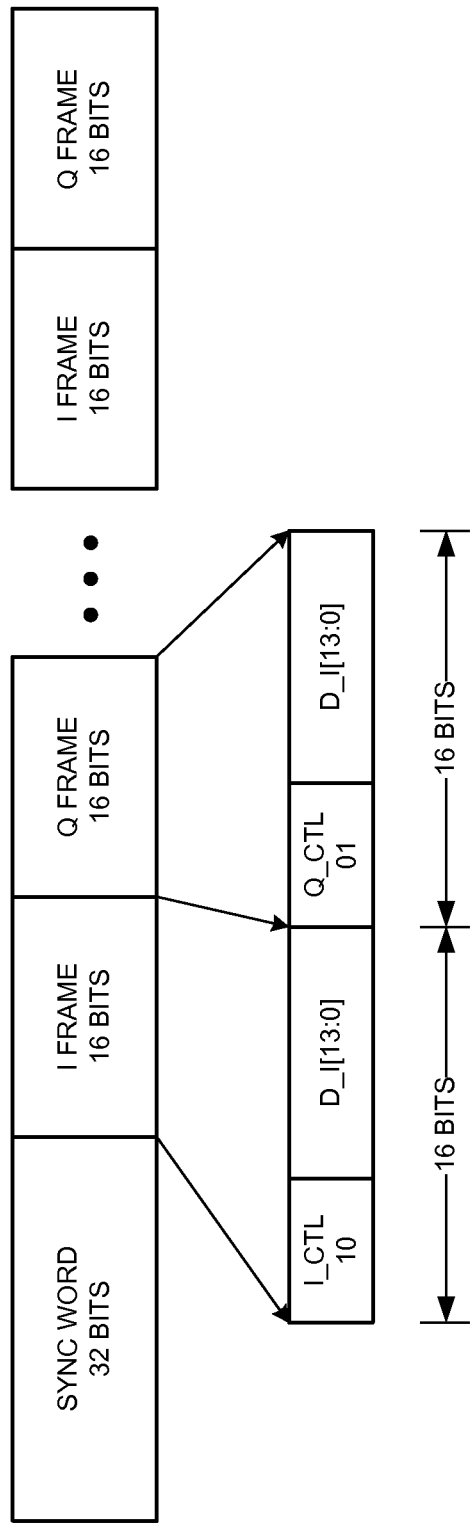

| Bit | Name | Default | Description |
|---|---|---|---|
| 0 | spi_reset | 1'b0 | Software reset. When this bit is 1, the design will be reset. It must be set to 0 to exit the reset state. This will not affect the register values. |
| 1 | pd_tx | 1'b0 | When this bit is 1, the transmit block will be powered down. |
| 2 | pd_rx1 | 1'b0 | When this bit is 1, the receive block 1 will be powered down. |
| 3 | pd_rx2 | 1'b0 | When this bit is 1, the receive block 2 will be powered down. |
| 4 | loopback enable | 1'b0 | When this bit is 1, the loop back mode will be enabled. The transmit signal will be routed back to both receive 1 and 2. |
| 5 | enable rx bit alignment | 1'b0 | When this bit is 1, the bit alignment is enabled. The 32-bit pattern defined in bit 24~18 in this register and Alignment Pattern Register will be sent to Baseband controller. |
| 6 | enable sync pattern in tx and rx | 1'b0 | When this bit is 1, the synchronization pattern will be transmitted. If this bit is 0, the design will only search for the I_CTL. |
| 14-7 | rx clock bit alignment | 8'h0 | rclk to receive bit alignment from baseband controller. |
| 17-15 | reserved | 3'h0 | |
| 24-18 | bit alignment pattern[6:0] | 7'h0 | Stores bit alignment pattern low bits. |

FIG. 5A

| Bit | Name | Default | Description |
|---|---|---|---|
| 7-0 | DAC control | 8'h0 | control/configure signals to DAC |
| 15-8 | ADC control for receive 1 | 8'h0 | control/configure signals to ADC |
| 23-16 | ADC control for receive 2 | 8'h0 | control/configure signals to ADC |
| 24 | reserved | 1'b0 | |

FIG. 5B

| Bit | Name | Default | Description |
|---|---|---|---|
| 0 | tx sync status | 1'b0 | This bit indicates the sync status for transmit. Will be cleared by TX_EN. |
| 7-1 | tx debug status | 7'h0 | debug status for transmit |
| 15-8 | rx1 debug status | 8'h0 | debug status for receive 1 |
| 23-16 | rx2 debug status | 8'h0 | debug status for receive 2 |
| 24 | reserved | 1'b0 | |

FIG. 5C

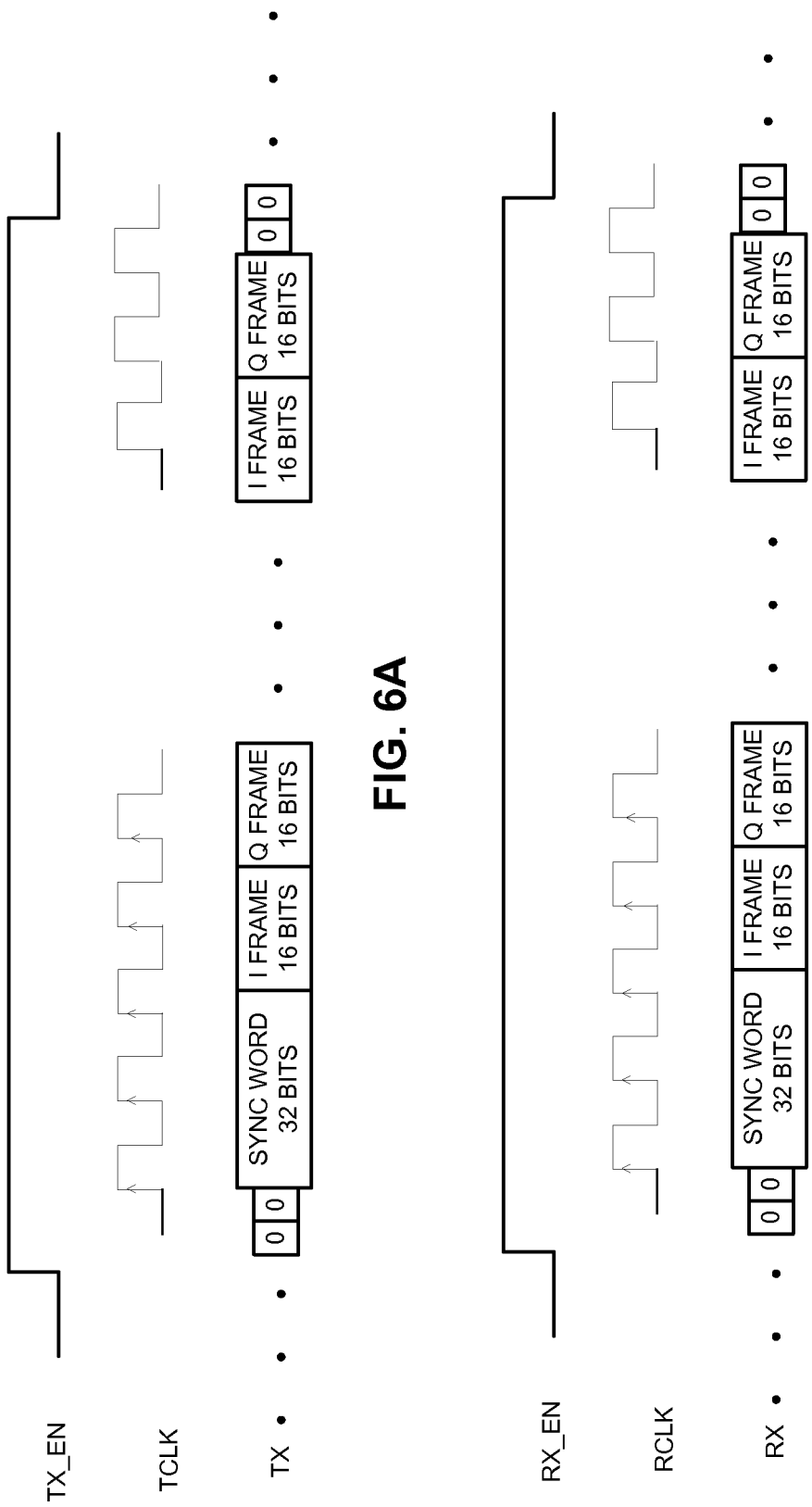

SERIAL DIGITAL INTERFACE BETWEEN AN RF TRANSCEIVER AND A BASEBAND CHIP

RELATED APPLICATION

This application claims the benefit of U.S. Provisional Application No. 61/730,333, entitled "Serial Digital Interface Between RF Transceiver and BB Chip," by inventors Tao Li, Hans Wang, Binglei Zhang, and Shih Hsiung Mo, filed 27 Nov. 2012.

BACKGROUND

1. Field

The present disclosure relates generally to a serial interface. More specifically, the present disclosure relates to a serial interface used between an RF transceiver integrated circuit (IC) chip and a baseband IC chip.

2. Related Art

Traditional wireless communication systems are usually designed for a specific standard, such as GSM (Global System for Mobile Communications), Wideband Code Division Multiple Access (W-CDMA), Wi-Fi® (registered trademark of Wi-Fi Alliance of Austin, Tex.), LTE (Long Term Evolution), just to name a few. Current demand for the convergence of wireless services, so that users can access different standards from the same wireless device, is driving the development of multi-standard and multi-band transceivers, which are capable of transmitting/receiving radio signals in the entire wireless communication spectrum (most are in a frequency range of from 300 MHz to 3.6 GHz).

The multi-band/multi-standard requirement also drives the need for developing a high-speed, low-overhead serial digital interface between the RF IC chip and the baseband IC chip on the wireless transceiver. However, interfaces defined by the current standard (such as the DigRF$^{SM}$ specification, available at the homepage of the MIPI® Alliance, mipi.org) often require complex redesign of the RF IC chip and the baseband chip, and can be energy inefficient.

SUMMARY

One embodiment of the present invention provides a device for interfacing between a baseband controller and an RF integrated circuit (IC) chip having a modulator and a demodulator. The device includes an analog-to-digital converter (ADC) coupled to the demodulator located on the RF IC chip. The ADC is configured to receive demodulated analog signals from the demodulator. The device further includes a serializer configured to generate a serial data frame based on the ADC's output, a first serial data port configured to send the serial data frame to the baseband controller, and a control module coupled to the baseband controller.

In a variation on this embodiment, the device further includes a deserializer coupled to the baseband controller. The deserializer is configured to receive serial data from the baseband controller, and is configured to convert the serial data received from the baseband controller to parallel data. The device also includes a DAC configured to convert the parallel data to analog signals, and an analog output configured to send the converted analog signals to the modulator.

In a variation on this embodiment, the device further comprises a signal converter configured to convert between single-ended digital signals and differential digital signals.

In a further variation, the differential digital signals are low-voltage differential signaling (LVDS) signals.

In a variation on this embodiment, the device comprises a clock module configured to provide clock signals to at least the ADC and the serializer.

In a variation on this embodiment, the control module includes at least a configuration register for controlling at least the ADC and the serializer, and a status register for indicating status of the serial data frame.

In a further variation, the ADC and the serializer are configured to be powered down by the baseband controller setting a particular bit in the configuration register.

In a variation on this embodiment, the control module is coupled to the baseband controller via a serial peripheral interface.

BRIEF DESCRIPTION OF THE FIGURES

FIG. 3B presents a diagram illustrating exemplary framed serial data generated by the serializer, in accordance with an embodiment of the present invention.

FIG. 5A presents a table listing the exemplary definitions and default values of bits in the configuration register, in accordance with an embodiment of the present invention.

FIG. 5B presents a table listing the exemplary definitions and default values of bits in the mixed-signal control register, in accordance with an embodiment of the present invention.

FIG. 5C presents a table listing the exemplary definitions and default values of bits in the status register, in accordance with an embodiment of the present invention.

FIG. 6A provides a diagram illustrating an exemplary timing diagram of the signals sent from the baseband controller to the interfacing device, in accordance with an embodiment of the present invention.

FIG. 6B provides a diagram illustrating an exemplary timing diagram of the signals sent from the interfacing device to the baseband controller, in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide an interfacing device that can provide a serial digital interface between the RF transmission/receiving circuit located on an RF IC chip and the baseband controller located on the baseband IC chip. The interfacing device includes one or more analog-to-digital converters (ADCs) and one or more digital-to-analog converters (DACs) for converting RF signals between analog and digital domains, one or more serializers/deserializers for converting between parallel digital signals and serial digital signals, and a status register. The ADCs and DACs direct interface with the I and Q channels of the transmitting and receiving circuits located on the RF IC chip. During operation, the ADCs receive I/Q bitstreams from the receiving circuit, and convert them from the analog domain to the digital domain; the serializer converts the ADCs' parallel output into serial data before feeding it to the baseband IC for further processing. On the other hand, the deserializer converts serial digital data received from the baseband IC into parallel data that is fed to the DACs, which convert the digital data to analog signals. The status register can be controlled by the baseband chip via a serial peripheral interface (SPI).

A Serial Digital Interfacing Device

Figure 1:
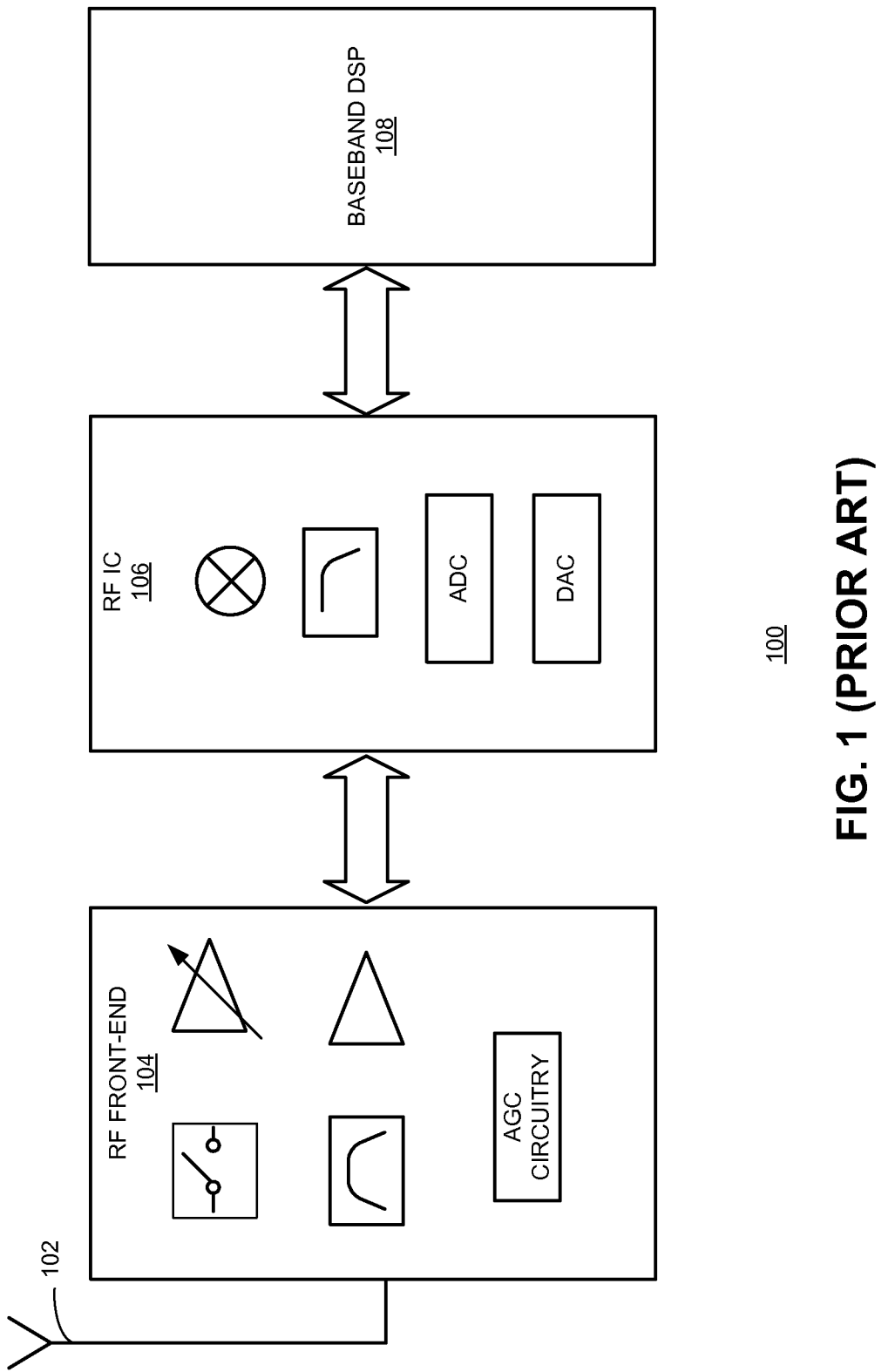
FIG. 1 presents a diagram illustrating the architecture of a conventional radio (prior art).

FIG. 1 presents a diagram illustrating the architecture of a conventional radio (prior art). In FIG. 1, radio 100 includes an antenna 102, an RF front-end block 104, an RF integrated circuit (IC) chip 106, and a baseband digital signal processor (DSP) chip 108. RF front-end block 104 includes a number of RF front-end components, such as switches (for frequency band and operation mode selection), band-pass filters (BPFs), amplifiers (including low-noise amplifiers (LNAs) and power amplifiers (PAs)), automatic gain control (AGC) circuitry, etc. RF IC chip 106 may include other transceiver components that are integrated on a single IC chip, such as modulators/demodulators, filters, analog-to-digital converters (ADCs), digital-to-analog converters (DACs), etc. Baseband DSP 108 is responsible for processing the received signals as well as generating transmitted signals. In FIG. 1, the interface between RF front-end block 104 and RF IC chip 106 and the interface between RF IC chip 106 and baseband DSP 108 are not specified. Designers of RF IC chip 106 and baseband DSP 108 often have to come up with their own interfacing solutions.

MIPI® Alliance has been developing interface specifications for baseband ICs and RF ICs in mobile devices. However, most currently available RF ICs and baseband ICs are not MIPI® ready, and these specifications do not provide physical implementation solutions for high-speed, energy-efficient serial digital interfaces. To solve this problem, embodiments of the present invention provide an interfacing device that enables communications between a generic RF IC chip and a generic baseband IC chip. More specifically, the interfacing device receives/transmits analog signals from/to the generic RF IC chip and uses a serial interface to communicate with the generic baseband IC chip.

Figure 2:
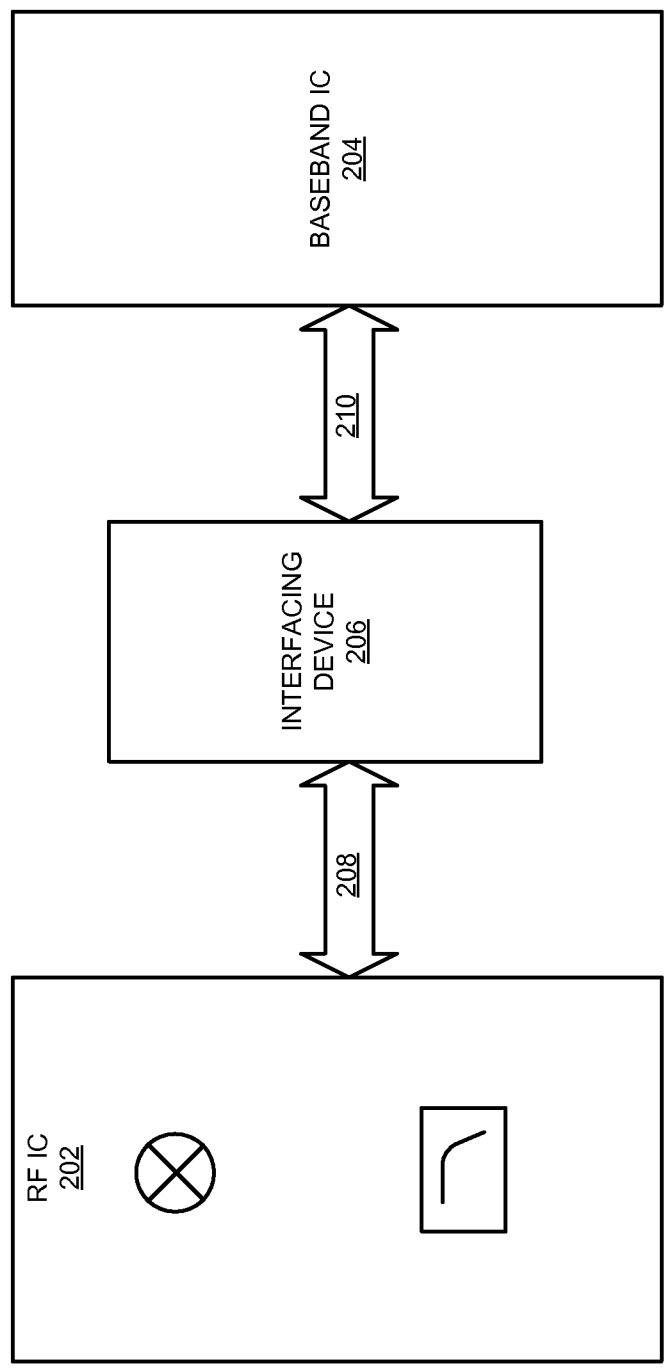
FIG. 2 presents a diagram illustrating the interfacing architecture between an RF IC chip and a baseband chip, in accordance with an embodiment of the present invention.

FIG. 2 presents a diagram illustrating the interfacing architecture between an RF IC chip and a baseband chip, in accordance with an embodiment of the present invention. In FIG. 2, a generic RF IC 202, which may include any ADCs or DACs, is coupled to a generic baseband IC 204 via an interfacing device 206. More specifically, generic RF IC 202 is coupled to interfacing device 206 via an analog interface 208, and baseband IC 204 is coupled to interfacing device 206 via a serial digital interface 210. Note that because RF IC 202 only needs to provide an analog interface over which analog signals (such as demodulated IQ signals) are communicated, the design for RF IC 202 becomes much simpler and more straightforward.

Figure 3A:
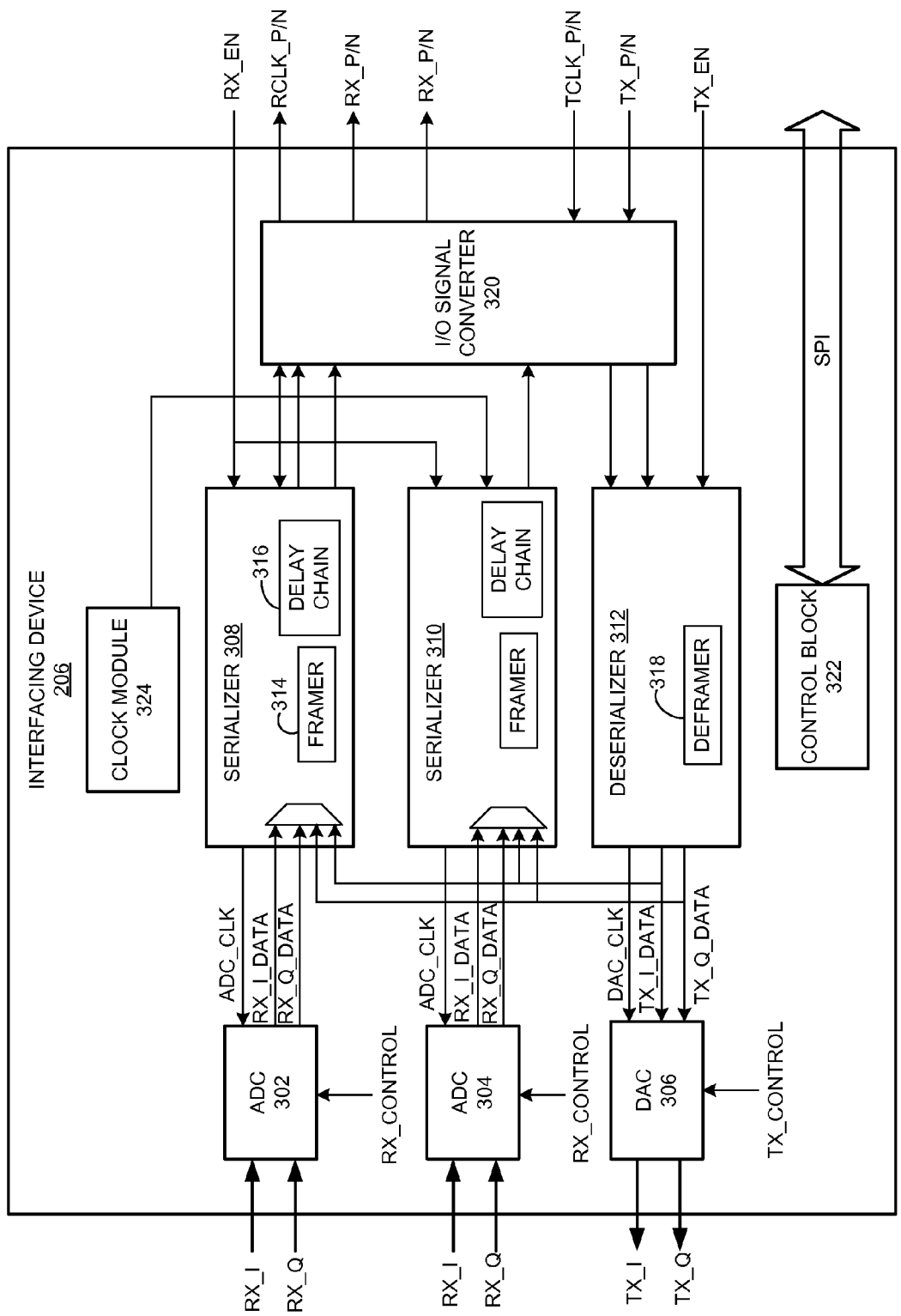
FIG. 3A presents a diagram illustrating an exemplary architecture of an interfacing device, in accordance with an embodiment of the present invention.

FIG. 3A presents a diagram illustrating an exemplary architecture of an interfacing device, in accordance with an embodiment of the present invention. In FIG. 3A, interfacing device 206 includes a number of ADCs (such as an ADC 302 and an ADC 304), a number of DACs (such as a DAC 306), a number of serializers (such as a serializer 308 and a serializer 310), a number of deserializers (such as a deserializer 312), an I/O signal converter 320, a control block 322, and a clock module 324. Interfacing device 206 can have different implementations. In one embodiment, interfacing device 206 can be implemented as an application-specific integrated circuit chip. In a different embodiment, interfacing device 206 can be implemented using field-programmable gate arrays (FPGAs)

During operation, the ADCs receive analog signals from the receiver modules on the RF IC. In some embodiments, the RF signals are modulated using a quadrature modulation scheme, and the ADCs are configured to receive both I and Q signals. In the example shown in FIG. 3A, interfacing device 206 includes two ADCs, thus is capable of receiving signals from two independently operated receiver modules located on the RF IC chip. In addition, each ADC may include dual ADC modules for parallel conversion of the I and Q analog signals. For example, ADC 302 can be configured to receive I and Q signals (marked as RX_I and RX_Q in FIG. 3A) from one receiver module operating at a certain frequency band, whereas ADC 304 can be configured to receive I and Q signals from another receiver module operating at a different frequency band. Each ADC converts the received analog signals to parallel digital data sequences (marked as RX_I_DATA and RX_Q_DATA for I and Q data, respectively, in FIG. 3A). The width of the ADC can be selected based on the desired resolution. In one embodiment, the ADCs are 14-bit or 16-bit ADCs. In other words, the ADCs are configured to convert the received analog signals (including both I and Q signals) to 14-bit data sequences. In a further embodiment, the ADCs output the converted digital data in parallel. For 14-bit ADCs, there are 14 outputs (one per bit) for each received I or Q signal. Note that, in FIG. 3A, the ADC outputs, such as RX_I_DATA and RX_Q_DATA, are in fact multi-bit parallel outputs.

The parallel outputs, including both the I and Q samples, of an ADC are then sent to a serializer, which converts the parallel data to serial data. More specifically, the serializer may include a framer and a delay chain. For example, serializer 308 includes a framer 314 and a delay chain 316. The framer is responsible for constructing serial data frames using the parallel data. For example, the framer can construct one I or Q data frame for each I or Q parallel data. The delay chain is responsible for applying an appropriate delay in order to accurately align the received data with the clock. FIG. 3B presents a diagram illustrating exemplary framed serial data generated by the serializer, in accordance with an embodiment of the present invention. In FIG. 3B, the serial data includes an optional sync word followed by alternating I and Q data frames. Each I data frame includes an I frame header (marked as I_CTL in FIG. 3B), and each Q data frame includes a Q frame header (marked as Q_CTL in FIG. 3B). The sync word can be enabled or disabled by the baseband controller. In one embodiment, the sync word is 32 bits long, and its pattern can be programmed to be high or low. In one embodiment, the I and Q data frames are 16 bits long with a 2-bit frame header and 14 bit data. Note that the length of the data is determined by the width of the ADC. In a further embodiment, the I frame header bits are configured as 10, and the Q frame header bits are configured as 01.

The output of the serializers (in the format shown in FIG. 3B) is sent to I/O signal converter 320, which is responsible for converting the single-ended digital output of the serializers to differential digital signals (marked as RX_P/N in FIG. 3A). In addition, the single-ended clock signal is also converted to a differential clock signal (marked as RCLK_P/N in FIG. 3A) by I/O signal converter 320. The converted differential signals are then ready to be fed to the baseband IC chip. In one embodiment, the converted differential signals, including the RX_P/N and the RCLK_P/N, are low-voltage differential signaling (LVDS) signals.

The transmission path is the reverse of the receiving path. More specifically, I/O signal converter 320 converts differential digital signals (including signals to be transmitted and the clock signals) received from the baseband IC chip to single-ended digital signals, which are then fed to deserializer 312, which includes a deframer 318. In one embodiment, the differential digital signals are LVDS signals. Deframer 318 is responsible for removing headers of the data frames received from the baseband IC chip via I/O signal converter 320. After the frame header has been removed, deserializer 312 converts the serial data into parallel data, and then feeds the parallel data into the I and Q input of DAC 306 (marked as TX_I_DATA and TX_Q_DATA in FIG. 3A). In one embodiment, DAC 306 subsequently converts the digital data for transmission to analog I and Q signals (marked as TX_I and TX_Q, respectively) and sends the analog I and Q signals to the transmitter module located on the RF IC chip. Note that in the example shown in FIG. 3A, interfacing device 206 includes only one DAC, meaning that it is capable of interfacing with an RF IC chip that includes only one transmitter module. In some embodiments, interfacing device 206 may include multiple DACs for interfacing with an RF IC that includes multiple transmitter modules.

Control block 322 enables the baseband IC chip to control the operation of the various components on interfacing device 206, such as ADCs, DACs, and clock module 324. More specifically, control block 322 includes a number of internal multi-bit registers, and the various configurations of the multi-bit registers indicate different control statuses. The baseband IC chip can configure the registers within control block 322 by communicating with it via different types of interface. In one embodiment, control block 322 communicates with the baseband IC chip via a serial peripheral interface (SPI) bus. In a further embodiment, the SPI bus not only allows the baseband IC chip to control components on interfacing device 206, but also allows the baseband IC chip to control components on the RF IC chip.

In one embodiment, the SPI includes four pins for providing four signals, the clock signal (SPI_CLK), the serial data (SPI_DATA), the latch-enable signal (SPI_CE), and the read-back signal (SPI_RDBK). More specifically, the read-back pin is a digital pin and can be used to read back values of the different internal registers located within control block 322.

Figure 4:
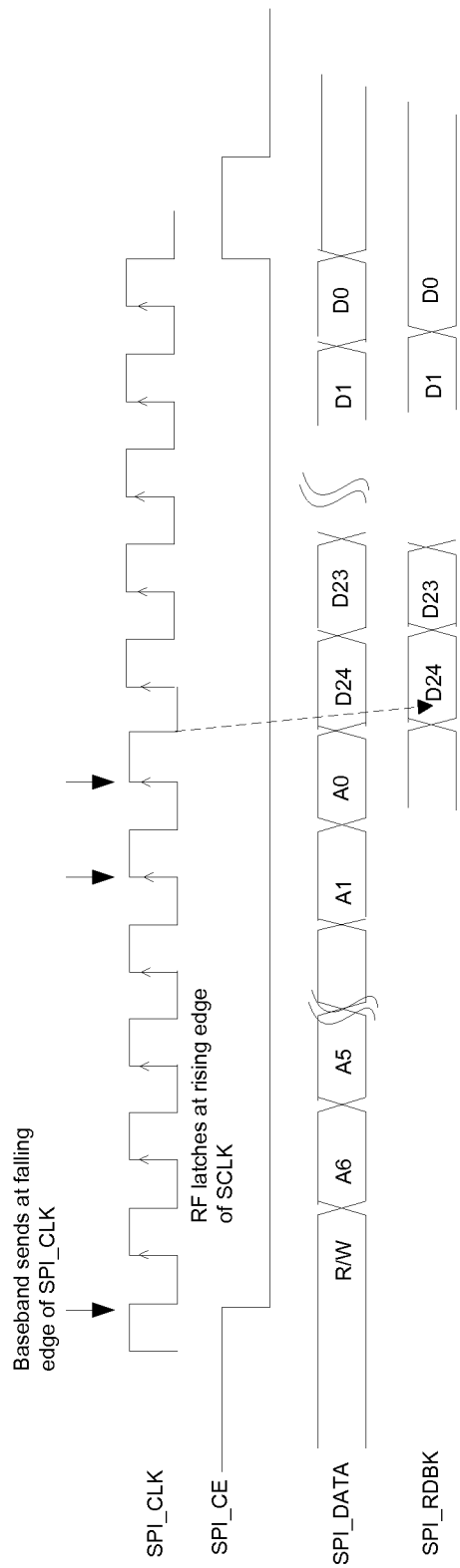
FIG. 4 illustrates an exemplary SPI timing diagram, in accordance with an embodiment of the present invention.

FIG. 4 illustrates an exemplary SPI timing diagram, in accordance with an embodiment of the present invention. During operation, the latch-enable (SPI_CE) signal is sent by the baseband chip at the falling edge of the SPI_CLK signal. The SPI_CE signal activates the SPI interface by activating the clock signal. In the example shown in FIG. 4, the SPI_CE is an active-low signal, meaning that the clock signal is active when the SPI_CE is low.

In the example shown in FIG. 4, the MSB of the SPI data is the read/write selection bit. In one embodiment, when the read/write selection bit is low, a write operation is performed over the SPI interface; otherwise, a read operation is performed. The next 7 bits (A6-A0) specify the register address to which the read/write operation is performed. The remaining least significant bits (LSBs) are data bits read from or written to the registers. Note that in one embodiment, the registers are 25-bit registers, and the data bits include the last 25 LSBs (D24-D0).

For a write operation, data at the SPI_DATA pin is shifted in with the most significant bit (MSB) first and is framed by the SPI_CE signal. When the SPI_CE signal is low, the clock signal (SPI_CLK) is active, and the input data is shifted on the rising edge of the SPI_CLK signal (as shown in FIG. 4). At the rising edge of the SPI_CE signal, the data bits (D24-D0) are latched into the register selected by the address bits (A6-A0). During the read operation, register data selected by the address bits is shifted out to the read-back (SPI_RDBK) pin at the falling edge of the clock signal (SPI_CLK), as indicated by the dashed arrow shown in FIG. 4. The register content can be preserved in certain "shutdown" modes (such as in a power-saving mode where the clock is deactivated) as long as the power voltage is maintained. However, the register will be reset to default values every time when the power voltage is turned on.

Control block 322 can include a number of internal registers, including, but not limited to: a configuration register, an alignment-pattern register, a number of sync-pattern registers, a mixed-signal control register, a number of clock-control registers, and a status register. More specifically, the configuration register enables the baseband chip to control or configure the various components on interfacing device 206. In one embodiment, the address of the configuration register is 0x75. FIG. 5A presents a table listing the exemplary definitions and default values of bits in the configuration register, in accordance with an embodiment of the present invention.

In FIG. 5A, bit 0 of the configuration register is the reset bit used for resetting the software. The default value of bit 0 is 1'b0. The default values of bits 1-3 are all 1'b0. The transmission block (including the DAC and the deserializer) and two receiving blocks (including the ADCs and the serializers) can be powered down by setting these bits. Note that this enables the baseband controller to provide more flexible power management. More specifically, the baseband controller can shut off the power of the different function blocks within interfacing device 206 completely or partially by configuring the configuration register (via the SPI interface) depending on system requirements, thus achieving higher levels of power efficiency. Bit 4 of the configuration register is for enabling loopback. When this bit is set, the loop back mode is enabled and the transmit signal will be routed back to both receivers. Bit 5 is for enabling RX bit alignment. When bit alignment is enabled, the baseband controller can align the serialized data with respect to the clock signal. More specifically, the baseband controller can detect any misalignment between the receiving clock (RCLK) and the received data (RX), and communicate the required adjustment amount to interfacing device 206 via the SPI interface.

Bit 6 of the configuration register is used for enabling synchronization pattern in TX and RX mode. During transmission, if this bit is set, the synchronization pattern will be transmitted by the baseband controller, and interfacing device 206 will search for the synchronization pattern before deframing the data received from the baseband chip. Otherwise, it only searches for the I_CTL bits. Bits 14-7 are the RX clock bit alignment bits, indicating the desired delay needed to achieve alignment between the RCLK and RX; the default value is 8'h0. Note that the desired delay is sent from the baseband controller based on the bit-alignment calibration result. Bits 17-15 are 3 reserved bits with a default value of 3'h0. Bits 24-18 store the lower 7 bits of the bit alignment pattern (note that the higher 25 bits of the bit alignment pattern are stored in the alignment-pattern register). In one embodiment, the SPI address of the alignment-pattern register is 0x76.

FIG. 5B presents a table listing the exemplary definitions and default values of bits in the mixed-signal control register, in accordance with an embodiment of the present invention. The mixed-signal control register defines the control of the ADCs and DACs. The control signals can include a power-down signal, a clock-gating signal, etc. Bits 7-0 of the mixed-signal control register are for DAC control, and bits 15-8 and bits 23-16 are for ADC control to the two receiving blocks. Bit 24 is reserved.

The clock-control registers provide controls to the clock module. In one embodiment, interfacing device 206 includes two clock modules (each can include a phase-locked loop interfacing with an off-chip crystal oscillator), and each clock module can be controlled by one clock-control register.

The sync-pattern registers define the lower bits and higher bits of the sync pattern. In one embodiment, a sync-pattern low register defines the 25 lower bits of the sync pattern, and a sync-pattern high register defines the remaining 7 higher bits. The default value for the sync pattern is 0. The sync pattern can be programmed by setting the values in the sync-pattern low register and the sync-pattern high register. In a further embodiment, the addresses for the sync-pattern low register and the sync-pattern high register are 0x7A and 0x7B, respectively.

The status register allows the baseband controller to poll the various statuses, such as synchronization status, debug status, etc., of interfacing device 206. FIG. 5C presents a table listing the exemplary definitions and default values of bits in the status register, in accordance with an embodiment of the present invention. Bit 0 of the status register indicates the sync status of the transmission. During transmission, the baseband controller can poll the synchronization status by reading this value. If the baseband controller finds out that this bit does not change to "high" sometime after transmit, the baseband controller can terminate the transmission by pulling down the transmission enable (TX_EN) signal. Bits 7-1 indicate the debug status of the transmission path, and bits 15-8 and bits 23-16 indicate the debug status of the two receiving paths. Bit 24 is reserved. In one embodiment, the address of the status register is 0x7c.

Note that in addition to the aforementioned registers, control block 322 may include additional registers that can be used to provide control functions to other components on interfacing device 206. In one embodiment, three additional registers with addresses ranging from 0x7D to 0x7F are reserved for providing additional control functions.

FIG. 6A provides a diagram illustrating an exemplary timing diagram of the signals sent from the baseband controller to the interfacing device, in accordance with an embodiment of the present invention. Three signals are sent from the baseband controller to the interfacing device, including the transmission enable signal (TX_EN), the transmission clock (TCLK), and the transmission serial data (TX). In FIG. 6A, the serial data is aligned with the rising clock edge, and the serial data is clocked in at both edges of the clock signal (for double data rate (DDR) schemes). The rising edge of the transmission enable signal (TX_EN) activates the transmission clock (TCLK), and the interfacing device enters the state of searching for sync word mode if the sync word is enabled at the configuration register, or it searches for I_CTL if the sync word is disabled. The baseband controller can poll the synchronization status by reading the status register via the SPI interface. In one embodiment, the transmission sync status bit (bit 0 in the status register) indicates whether the sync word has been found. If synchronization is achieved, the serial data is packed and sent to the DAC. On the other hand, if the transmission sync status bit does not change to "high" sometime after transmission (meaning synchronization fails), the baseband controller can terminate the transmission by pulling TX_EN to low. Note that when TX_EN is low, the TCLK is disabled, thus resulting in all transmission blocks (including the deserializer and the DAC) consuming less power.

FIG. 6B provides a diagram illustrating an exemplary timing diagram of the signals sent from the interfacing device to the baseband controller, in accordance with an embodiment of the present invention. Three signals are sent from the interfacing device to the baseband controller, including the receiving enable signal (RX_EN), the receiving clock (RCLK), and the receiving serial data (RX). The timing diagram in FIG. 6B is similar to the timing diagram in FIG. 6A. In FIG. 6B, the rising edge of the receiving enable signal (RX_EN) activates the receiving clock (RCLK), causing the serializer to start to send the sync word (if enabled), the I frame, and the Q frame to the baseband controller. Note that, if there are two receiving paths, the RCLK is activated on both paths. The baseband controller can poll the synchronization status of the received data by reading the status register via the SPI interface. In one embodiment, if the baseband controller finds out that the received data is out of sync, it can terminate the receiving process prematurely by pulling RX_EN to low. Note that when RX_EN is low, the RCLK is disabled, thus resulting in all receiving blocks (including the serializers and the ADCs) consuming less power. In one embodiment, the baseband controller can be configured to calibrate the alignment between the RX and the RCLK. In a further embodiment, bit alignment can be enabled by bit 5 in the configuration register, and the bit alignment pattern can be defined in the configuration register (bits 24-18) and the alignment pattern register. The detected misalignment value between the RX and RCLK can be communicated back to the configuration register (as bits 14-7) from the baseband controller.

Figure 7A:
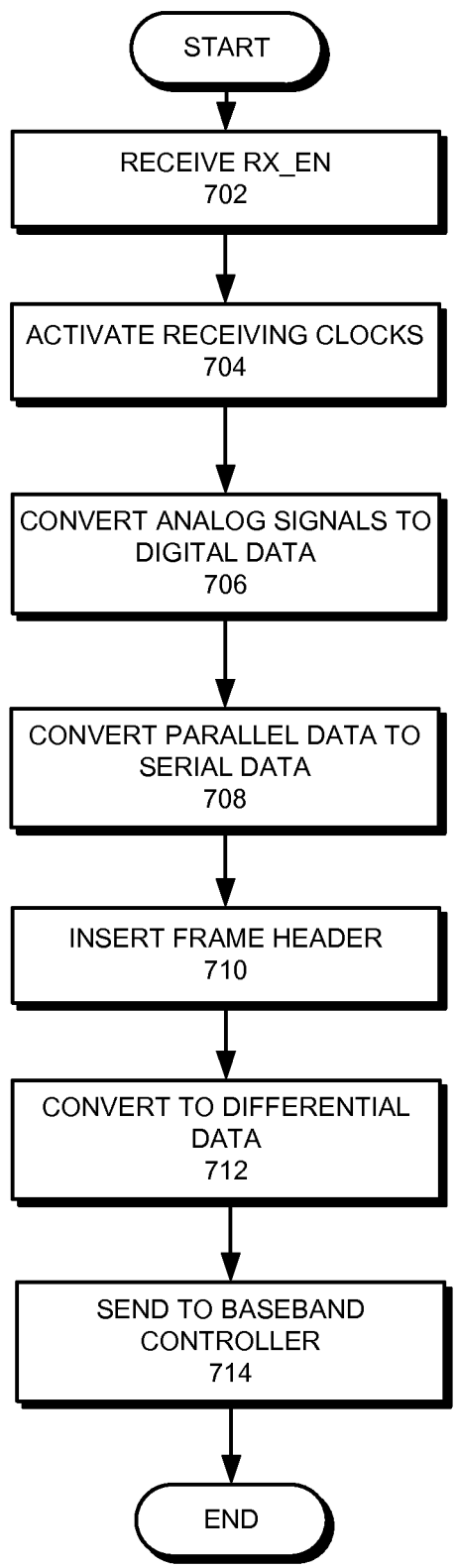
FIG. 7A presents a flowchart illustrating an exemplary receiving process performed by the interfacing device, in accordance with an embodiment of the present invention.

FIG. 7A presents a flowchart illustrating an exemplary receiving process performed by the interfacing device, in accordance with an embodiment of the present invention. During operation, the interfacing device receives a receiving enable signal from the baseband controller (operation 702). The receiving enable signal is a level signal that enables receiving. In one embodiment, the receiving enable signal is a high level signal. In response to receiving the receiving enable signal, the receive clocks that are fed to the ADCs and the serializers are activated (operation 704). Once the clock is activated, the ADCs convert the analog I and Q signals to the digital domain and send the converted digital I and Q signals to the serializers (operation 706). In one embodiment, each I and Q sample is 14 bits wide and is sent to the serializers as parallel data. The serializers then convert the parallel data to serial data (operation 708), and assemble the I and Q digital data into a serial data frame by inserting an appropriate frame header (operation 710). In one embodiment, if the sync word is enabled, the assembled digital frame includes a sync word in its frame header. Subsequently, the I/O signal converter converts the serial data frame from single-ended signals to differential signals (operation 712). In one embodiment, the differential data is LVDS data. Note that utilization of the LVDS data ensures both power efficiency and high speed. The differential serial data is then sent to the baseband controller via a serial interface for processing (operation 714).

Figure 7B:
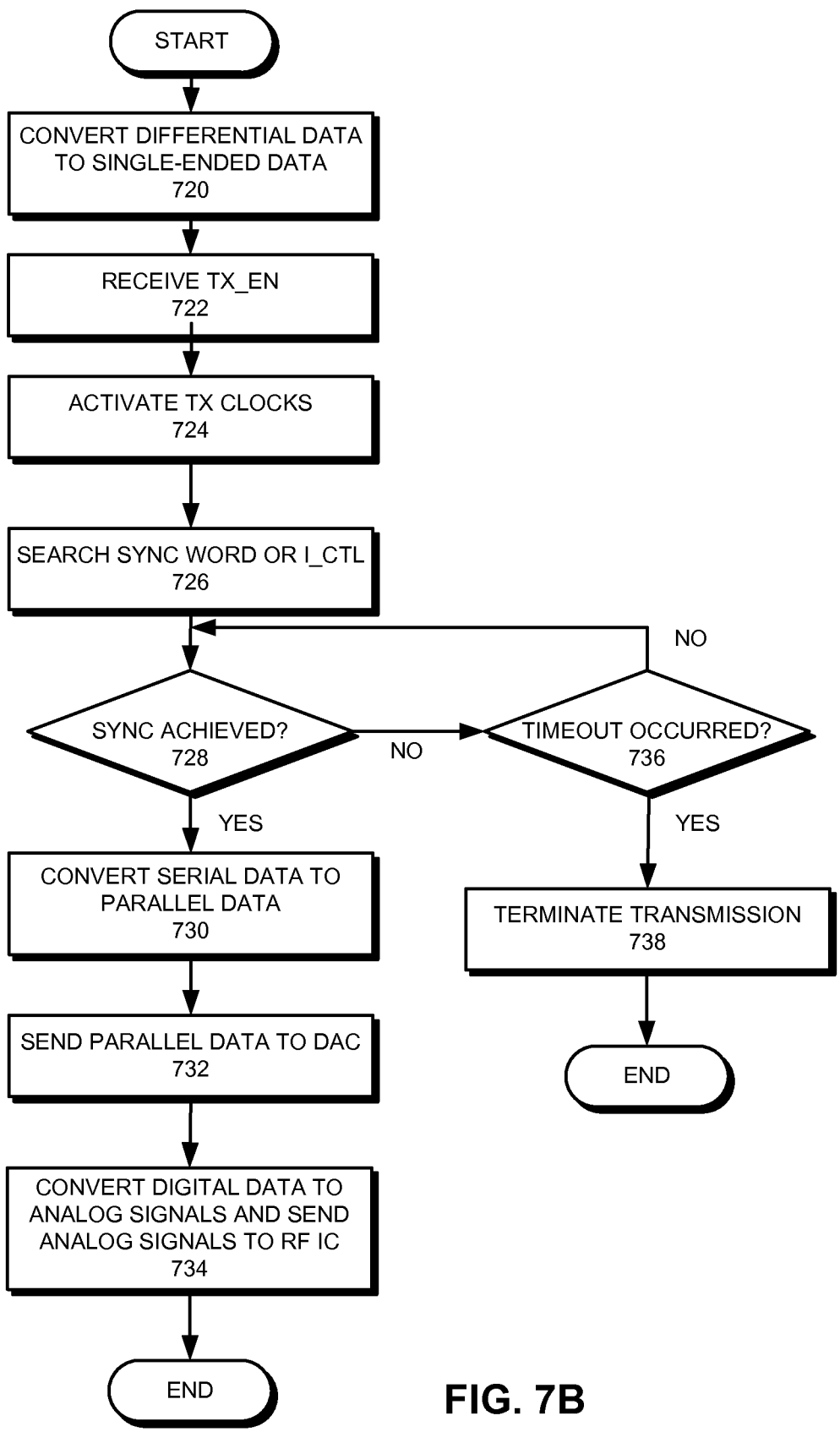
FIG. 7B presents a flowchart illustrating an exemplary transmission process performed by the interfacing device, in accordance with an embodiment of the present invention.

FIG. 7B presents a flowchart illustrating an exemplary transmission process performed by the interfacing device, in accordance with an embodiment of the present invention. During operation, differential data sent from the baseband controller to the interfacing device is converted to single-ended data (operation 720). In response to the interfacing device receiving a transmission enable signal from the baseband controller (operation 722), the transmit clocks that are fed to the DAC and the de-serializer are activated (operation 724). The transmission enable signal is a level signal that enables transmission. In one embodiment, the transmission enable signal is a high level signal. Once the clock is activated, the deserializer starts to search for the sync word, if the sync word is enabled, or it searches for the I_CTL bits (operation 726). Upon locating the sync word, the synchronization status is polled by the baseband controller to determine whether synchronization is achieved (operation 728). If so, the deserializer converts the serial data frame received from the baseband controller into parallel data blocks (operation 730), and sends the parallel data blocks (including both the I data sample and the Q data sample) to corresponding DAC inputs (operation 732). Subsequently, the DAC converts the digital data to analog I and Q signals and sends the analog I and Q signals to the appropriate inputs on the RF IC chip (operation 734). If it determines that synchronization failed, the system determines whether a timeout event occurred before synchronization is achieved (operation 736). If synchronization cannot be achieved after the predetermined time period, the system terminates the transmission by pulling the transmission enable signal low (operation 738).

In general, embodiments of the present invention provide a low-power, high-speed serial interface between the baseband chip and the modulator/demodulator on the RF IC. Note that such an arrangement significantly simplifies and standardizes the design of the RF IC, as well as the baseband chip. More specifically, the RF IC only needs to provide analog input/output, and the pin number on the baseband chip can be limited. In one embodiment, for dual-band receiving, the baseband chip only needs to provide no more than seven signal lines for clocks and data, and a standard control interface. In a further embodiment, the standard control interface is an SPI interface. In some embodiments, the data and clock signals communicated between the baseband controller and the interfacing device are both LVDS signals, thus ensuring both power efficiency and a high data rate. In addition, the interfacing device provides different levels of power saving. When the interfacing device is not in TX or RX mode, the corresponding TX or RX clock is disabled, respectively. In addition, the baseband controller can set the configuration register to shut off the power of different blocks within the interfacing device completely or partially, depending on the system requirements.

Note that the architecture shown in FIG. 3A is merely exemplary and should not limit the scope of this disclosure. For example, in FIG. 3A, the interfacing device includes two ADCs and one DAC. In practice, the number of ADCs and DACs can be different. Similarly, the interfacing device may have more or fewer components. For example, the I/O signal converter can be optional. Moreover, in FIG. 3A, the interface between the baseband controller and the control block is an SPI interface. In practice, other types of interfaces, such as an I$^2$C interface, a three-wire interface, a general purpose input/output (GPIO) interface, etc., are also possible.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A device for interfacing between a baseband controller and an a radio frequency (RF) integrated circuit (IC) chip having a modulator and a demodulator, comprising:
   an analog-to-digital converter (ADC) coupled to the demodulator located on the RF IC chip, wherein the ADC is configured to receive demodulated analog signals from the demodulator;
   a serializer configured to generate a serial data frame based on the ADC's output;
   a first serial data port configured to send the serial data frame to the baseband controller; and
   a control module coupled to the baseband controller, wherein the control module includes at least a configuration register for controlling at least the ADC and the serializer and a status register for indicating status of the serial data frame.

2. The device of claim 1, further comprising:
   a deserializer coupled to the baseband controller, wherein the deserializer is configured to receive serial data from the baseband controller, and wherein the deserializer is configured to convert the serial data received from the baseband controller to parallel data;
   a digital-to-analog converter configured to convert the parallel data to analog signals; and
   an analog output configured to send the converted analog signals to the modulator.

3. The device of claim 1, further comprising a signal converter configured to convert between single-ended digital signals and differential digital signals.

4. The device of claim 3, wherein the differential digital signals are low-voltage differential signaling (LVDS) signals.

5. The device of claim 1, further comprising a clock module coupled to the serializer, where in the clock module is configured to provide clock signals to at least the ADC and the serializer.

6. The device of claim 1, wherein the ADC and the serializer are configured to be powered down by the baseband controller setting a particular bit in the configuration register.

7. The device of claim 1, wherein the control module is coupled to the baseband controller via a serial peripheral interface.

8. A wireless transceiver, comprising:
   an radio frequency (RF) integrated circuit (IC) chip that comprises a modulator and a demodulator;
   a baseband controller; and an interfacing device coupled to the RF IC chip and the baseband controller, wherein the interfacing device comprises:
  an analog-to-digital converter (ADC) coupled to the demodulator, wherein the ADC is configured to receive demodulated analog signals from the demodulator;
  a serializer configured to generate a serial data frame based on the ADC's output;
  a first serial data port coupled to the baseband controller, wherein the first serial port is configured to send the serial data frame to the baseband controller; and
  a control module coupled to the baseband controller, wherein the control module includes at least a configuration register for controlling at least the ADC and the serializer and a status register for indicating status of the serial data frame.

9. The transceiver of claim 8, wherein the interfacing device further comprises:
  a deserializer coupled to the baseband controller, wherein the deserializer is configured to receive serial data from the baseband controller, and wherein the deserializer is configured to convert the serial data received from the baseband controller to parallel data;
  a digital-to-analog converter configured to convert the parallel data to analog signals; and
  an analog output coupled to the modulator, wherein the analog output is configured to send the converted analog signals to the modulator.

10. The transceiver of claim 8, wherein the interfacing device further comprises a signal converter configured to convert between single-ended digital signals and differential digital signals.

11. The transceiver of claim 10, wherein the differential digital signals are low-voltage differential signaling (LVDS) signals.

12. The transceiver of claim 8, wherein the interfacing device further comprises a clock module coupled to the serializer, wherein the clock module is configured to provide clock signals to at least the ADC and the serializer.

13. The transceiver of claim 8, wherein the ADC and the serializer are configured to be powered down by the baseband controller setting a particular bit in the configuration register.

14. The transceiver of claim 8, wherein the control module is coupled to the baseband controller via a serial peripheral interface.

* * * * *